United States Patent
Yong et al.

(10) Patent No.: US 9,552,995 B2
(45) Date of Patent: Jan. 24, 2017

(54) ELECTRICAL INTERCONNECT FOR AN ELECTRONIC PACKAGE

(71) Applicant: Intel Corporation, Santa Clara, CA (US)

(72) Inventors: Khang Choong Yong, Puchong (MY); Bok Eng Cheah, Bayan Lepas (MY); Teong Keat Beh, Bayan Lepas (MY); Howard L. Heck, Hillsboro, OR (US); Jackson Chung Peng Kong, Tanjung Tokong (MY); Stephen H. Hall, Forest Grove, OR (US); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/555,124

(22) Filed: Nov. 26, 2014

(65) Prior Publication Data
US 2016/0148866 A1    May 26, 2016

(51) Int. Cl.
| | |
|---|---|
| *H01L 23/498* | (2006.01) |
| *H01L 21/288* | (2006.01) |
| *H01L 23/00* | (2006.01) |
| *H01L 21/768* | (2006.01) |
| *H01L 23/48* | (2006.01) |

(52) U.S. Cl.
CPC ..... *H01L 21/2885* (2013.01); *H01L 21/76802* (2013.01); *H01L 21/76879* (2013.01); *H01L 23/48* (2013.01); *H01L 23/49838* (2013.01); *H01L 24/13* (2013.01); *H01L 23/49822* (2013.01); *H01L 2224/1302* (2013.01)

(58) Field of Classification Search
CPC .......................... H01L 31/115; H01L 27/14618
See application file for complete search history.

(56) References Cited

U.S. PATENT DOCUMENTS

| | | | | |
|---|---|---|---|---|
| 6,541,711 | B1* | 4/2003 | Dube | H05K 1/0219 174/255 |
| 7,842,886 | B2* | 11/2010 | Kobayashi | H01P 3/003 174/117 F |
| 8,962,349 | B1* | 2/2015 | Chen | H01L 43/12 257/421 |
| 2010/0155893 | A1* | 6/2010 | Chen | H01C 7/006 257/537 |
| 2012/0038053 | A1* | 2/2012 | Oh et al. | 257/773 |
| 2013/0107482 | A1* | 5/2013 | Inagaki | H01G 4/224 361/763 |
| 2013/0214400 | A1* | 8/2013 | Shu | B81B 7/0038 257/682 |
| 2014/0070346 | A1* | 3/2014 | Yang et al. | 257/428 |

* cited by examiner

*Primary Examiner* — Fernando L Toledo
*Assistant Examiner* — Neil Prasad
(74) *Attorney, Agent, or Firm* — Schwegman Lundberg & Woessner, P.A.

(57) ABSTRACT

Some example forms relate to an electrical interconnect for an electronic package. The electrical interconnect includes a dielectric layer that includes a trench formed into one surface of the dielectric layer and a signal conductor that fills the trench and extends above the one surface of dielectric layer. The electrical interconnect further includes a conductive reference layer mounted on an opposing side of the dielectric layer. The conductive reference layer is electromagnetically coupled to the signal conductor when current passes through the signal conductor.

24 Claims, 8 Drawing Sheets

ELECTRICAL INTERCONNECT FOR AN ELECTRONIC PACKAGE

TECHNICAL FIELD

Embodiments described herein generally relate to electronic packages, and more particularly to an electrical interconnect for an electronic package.

BACKGROUND

Mobile products (e.g., mobile phones, smart phones, tablet computers, etc.) are continually being designed to be more compact and portable. Therefore, it is extremely important to reduce the form factor, z-height and weight of the electronic devices that are included in mobile products.

One of the concerns that can arise as things are made smaller is signal integrity issues. As examples, channel impedance discontinuity and crosstalk are the common issues that are continually addressed during high-speed package and PCB design.

In some electronic devices, signal crosstalk is a common issue that occurs in conventional systems which include multiple high-speed parallel busses. Signal crosstalk issue may have negative design impacts by limiting the high-speed parallel bus design scaling (e.g., frequency, power, silicon real-estate, package layer-count and channel length).

Conventional solutions that seek to mitigate signal integrity issues typically require some form of design trade-off. One or more of these design trade-offs usually constrain enabling smaller form factor high-speed packages and PCBs as well as more compact high-speed packages and PCBs.

As a first example, high-speed packages and PCBs may increase the layer count and/or Z-height of the high-speed packages and PCBs. The number of signal routing layers and grounding layers may be increased to alleviate the signal integrity issues (e.g., due to breakout/congested routing areas or routing-over-void/split-plane areas).

As a second example, high-speed packages and PCBs may reduce routing density (i.e., increase in routing pitch). The layout of high-speed packages and PCBs may be optimized to reduce signal integrity issues by keeping interconnects with at least 2x-spacing away from one another to (i) reduce crosstalk; and (ii) have a transition to other routing layer to avoid routing over-void/split-plane areas.

As a third example, high-speed packages and PCBs may require an increase in power consumption. This increase in power consumption is typically combined with circuit patterns where active crosstalk cancellation and terminations are applied to mitigate crosstalk and reflection.

Therefore, a need exists for an interconnect structure that may address channel impedance discontinuity and crosstalk issues while minimizing any design trade-offs. Addressing channel impedance discontinuity and crosstalk issues while minimizing any design trade-offs may enable smaller form factor and more compact package & PCB designs. Smaller form factor and more compact package & PCB designs may be especially important in the mobile space of Wearables, Tablets, Smartphones and Ultrabooks (among other electronic devices).

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the electrical interconnect or electronic package.

The electrical interconnects and methods described herein may increase the coupling to the return path and reduce impedance mismatching (without corresponding design trade-offs in routing density and/or layer count). In addition, the electrical interconnects and methods described herein may be selectively or uniformly applied to particular regions of an electronic package.

The electrical interconnects and methods described herein may minimize the channel impedance mismatch as a result of routing-over-void/split-plane, and/or and shrinking trace width at breakout/congested region(s). In some other forms, the electrical interconnects and methods may additionally, or alternatively, minimize crosstalk while maintaining target impedance when the trace-to-trace spacing is reduced (e.g., when traces are located in a congested region).

Figure 1:
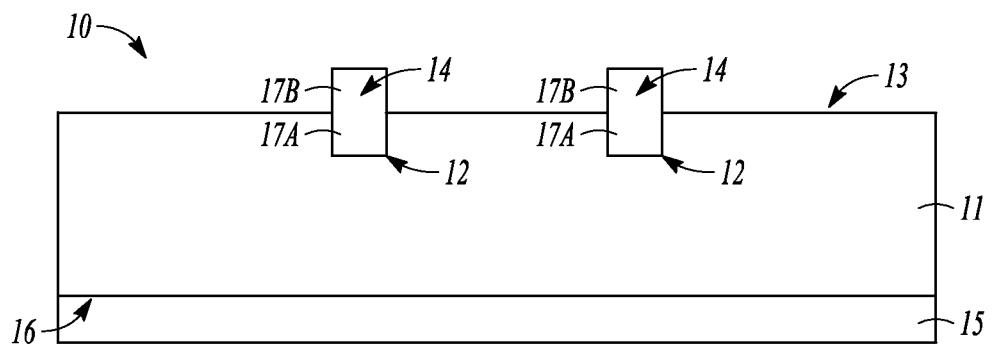
FIG. 1 illustrates an example an electrical interconnect for an electronic package.
Figure 2:
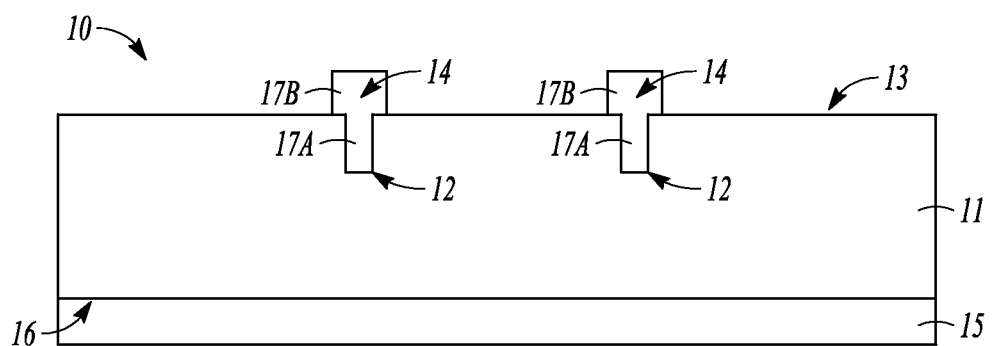
FIG. 2 illustrates another example an electrical interconnect for an electronic package.
Figure 3:
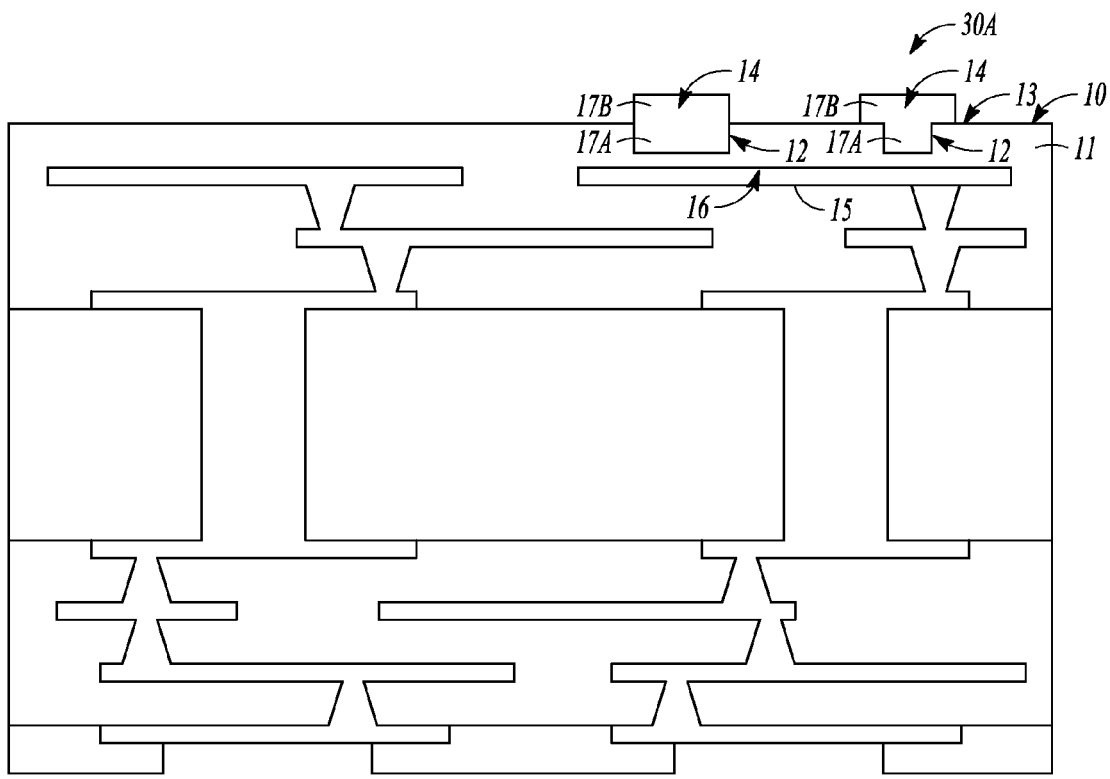
FIG. 3 illustrates an example electronic package that includes the example electrical interconnect of FIGS. 1 and/or 2.

FIGS. 1 and 2 illustrate example electrical interconnects 10 for an electronic package (not shown in FIG. 1). FIG. 3 illustrates an example electronic package 30A that includes the example electrical interconnect 10 of FIGS. 1 and/or 2.

As shown in FIGS. 1 and 2, the example electrical interconnect 10 includes a dielectric layer 11 that includes a trench 12 formed into one surface 13 of the dielectric layer 11. A signal conductor 14 fills the trench 12 and extends above the one surface 13 of dielectric layer 11. A conductive reference layer 15 is mounted on an opposing side 16 of the dielectric layer 11. The conductive reference layer 15 is electromagnetically coupled to the signal conductor(s) 14 when current passes through the signal conductor(s) 14.

The example electrical interconnect 10 may enable tighter electronic package/PCB routing pitch with minimum channel impedance mismatch (e.g., a target impedance of 50Ω) thereby providing for the possibility for form-factor reduction. The example electrical interconnect 10 may also improve electrical performance due to reduced signal reflections and crosstalk while minimizing insertion loss.

The signal conductor 15 may include a first portion 17A that fills the trench 12 and a second portion 17B that is above the trench. The first portion 17A may be integral with the second portion 17B (as shown in the FIGS. 1 and 2) or a separate piece that is engaged with the second portion 17B.

FIG. 1 shows where the first portion 17A of the signal conductor 14 may have the same width as the second portion 17B of the signal conductor 14. FIG. 2 shows where the first portion 17A of the signal conductor 14 may have a different width than the second portion 17B of the signal conductor 14. As shown in FIG. 2, the second portion 17B of the signal conductor 14 may engage the one surface 13 of dielectric layer 11.

FIGS. 1 and 2 show where the first portion 17A of the signal conductor 14 may have a different thickness than the second portion 17B of the signal conductor 14. It should be noted that forms of the electrical interconnect 10 are contemplated where the first portion 17A of the signal conductor 14 may have the same thickness as the second portion 17B of the signal conductor 14.

Figure 4:
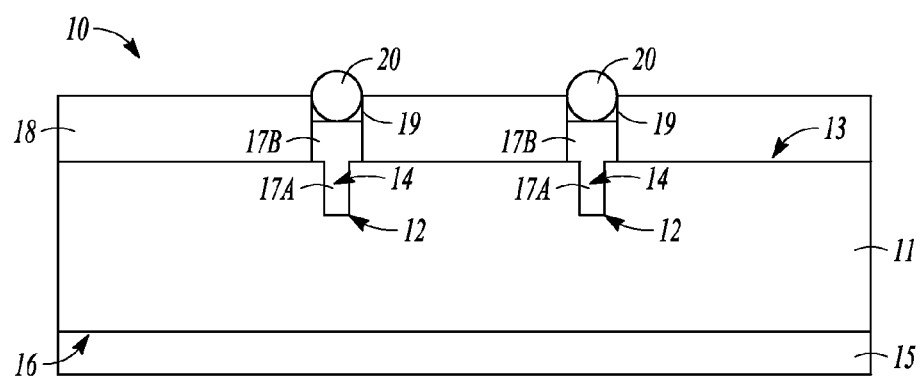
FIG. 4 illustrates the electrical interconnect of FIG. 2 where an additional dielectric layer and solder bumps have been added to the electrical interconnect.

In the example form of the electrical interconnect 10 that is illustrated in FIG. 4, the dielectric layer 11 is a first dielectric layer 11 and the electrical interconnect 10 further includes a second dielectric layer 18 mounted to the one surface 13 of the first dielectric layer 11. The second dielectric layer 18 includes an opening 19 that exposes the signal conductor 14.

Figure 5:
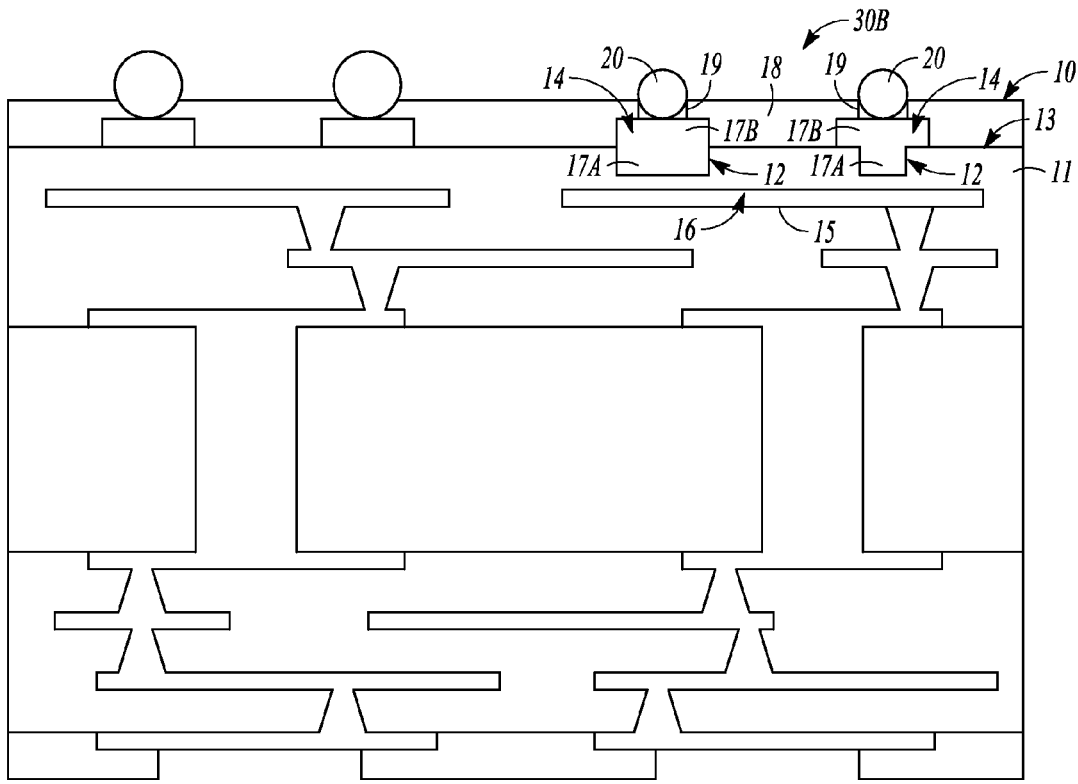
FIG. 5 illustrates another example electronic package that includes the example electrical interconnect of FIGS. 1, 2 and/or 4.

A solder bump 20 is electrically connected to the signal conductor 14 within the opening 19 in the second dielectric layer 18. FIG. 5 illustrates an example electronic package 30B that includes the example electrical interconnect 10 of FIGS. 1, 2 and/or 4.

The electrical interconnects 10 described herein may enable more flexibility when designing compact packages and PCB's layouts. In addition, the electrical interconnects 10 may allow for a higher degree of routing-over-void/split-plane areas.

In some forms, the electrical interconnects 10 may be used in locally congested regions to mitigate the crosstalk between signal conductors 14 in the locally congested regions. The electrical interconnects 10 may also potentially overcome the changing impedance within signal conductors 14 that may cause impedance mismatching (i.e., the first portion 17A of the signal conductor 14 may serve to restore the impedance).

Figure 6:
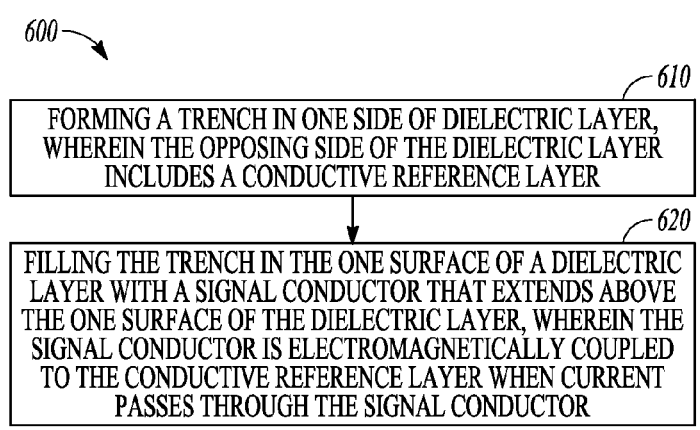
FIG. 6 is a flow diagram illustrating an example method of fabricating an electrical interconnect.
Figure 7:
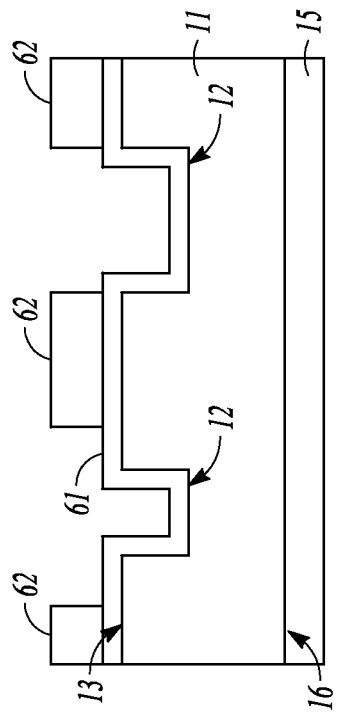
FIG. 7 illustrates a portion of the method of FIG. 6 where a trench and a conductive material are formed in one side of a dielectric layer.

FIG. 6 is a flow diagram illustrating an example method [600] of fabricating in electrical interconnect 10. The method [600] includes [610] forming a trench 12 (see FIG. 7) in one side 13 of a dielectric layer 11 where the opposing side 16 of the dielectric layer includes a conductive reference layer 15.

Figure 9:
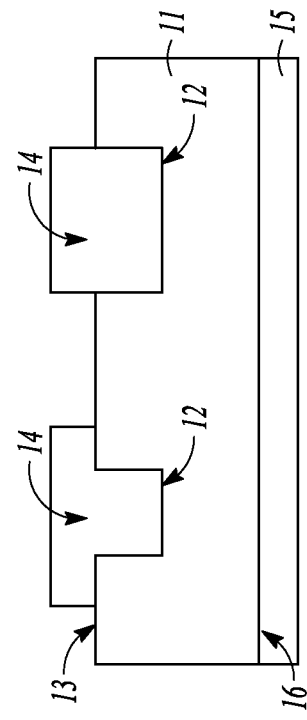
FIG. 9 illustrates another portion of the method of FIG. 6 where the trench is filled with a signal conductor that extends above the one surface of the dielectric layer.

The method [600] further includes [620] filling the trench 12 in the one surface 13 of a dielectric layer 11 with a signal conductor 14 that extends above the one surface 13 of the dielectric layer 11 (see, e.g., FIG. 9). The signal conductor 14 is electromagnetically coupled to the conductive reference layer 15 when current passes through the signal conductor 14.

In some forms of the method [600], [620] filling the trench 12 in the one surface 13 of the dielectric layer 11 with a signal conductor 14 may include (i) forming a conductive material 61 onto the one surface 13 of the dielectric layer 11 and within the trench 12 in the dielectric layer 11 (see FIG. 7); and (ii) forming a patterned mask 62 onto the conductive material 61.

Figure 8:
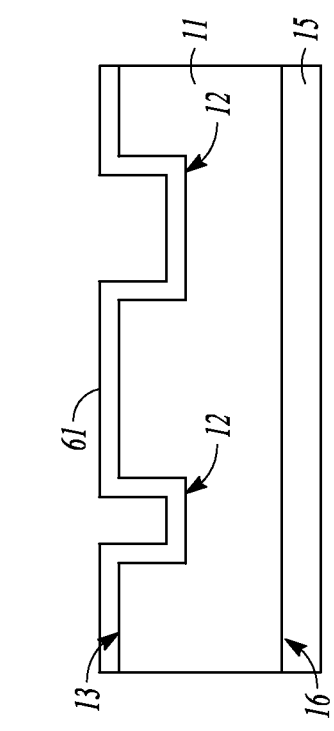
FIG. 8 illustrates another portion of the method of FIG. 6 where a patterned mask is formed onto the conductive material.

The patterned mask 62 is on the conductive material 61, which is on the one surface 13 of the dielectric layer 11, but not within the trench 12 on the dielectric layer 11 (see FIG. 8). As an example, the conductive material 61 may be formed onto the one surface 13 of the dielectric layer 11 and within the trenches 12 in the dielectric layer 11 by electroless plating (among other techniques that are known now or discovered in the future).

Figure 10:
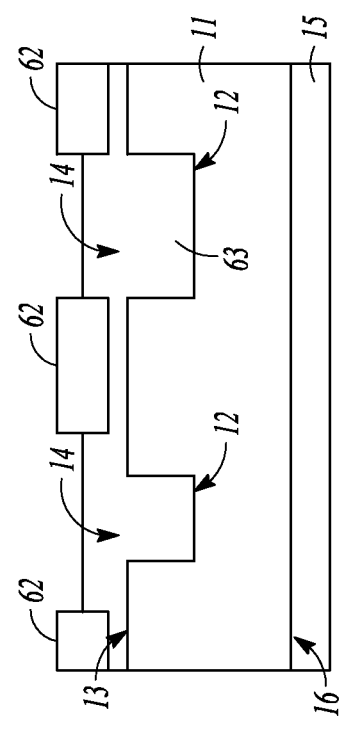
FIG. 10 illustrates another portion of the method of FIG. 6 where the patterned mask and the conductive material are removed from the one surface of the dielectric layer to form the signal conductor(s).

In addition, [620] filling the trench 12 in the one surface 13 of the dielectric layer 11 with a signal conductor 14 may include removing the patterned mask 62 and the conductive material 61 from the one surface 13 of the dielectric layer 11 to form the signal conductor(s) 14 (see FIG. 10).

As an example, the conductive material 63 may be formed within the trenches 12 to form the signal conductor(s) 15 by electrolytic plating (among other techniques that are known now or discovered in the future). In some forms of the method [600] one of the signal conductors 14 may be formed by electrolytic plating such that the signal conductor 14 engages the one surface 13 of the dielectric layer 11. It should be noted that the signal conductor 14 on the left of FIG. 10 does this but not the signal conductor 14 on the right.

Figure 11:
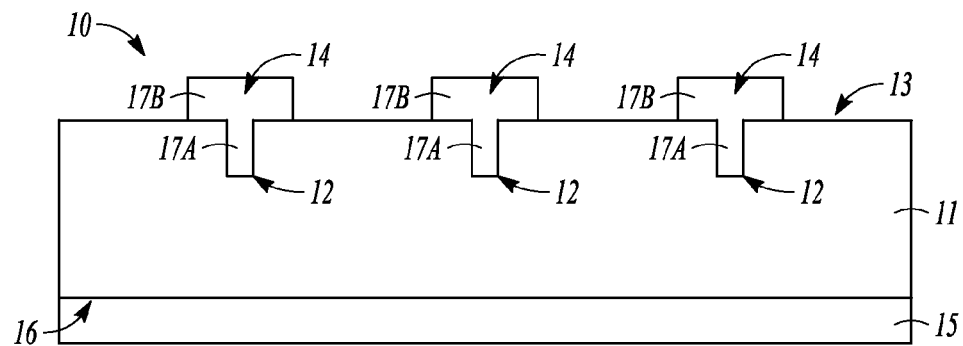
FIG. 11 shows an electrical interconnect that has been fabricated without any real misalignment between the first portion of the signal conductor and the second portion of the signal conductor.
Figure 12:
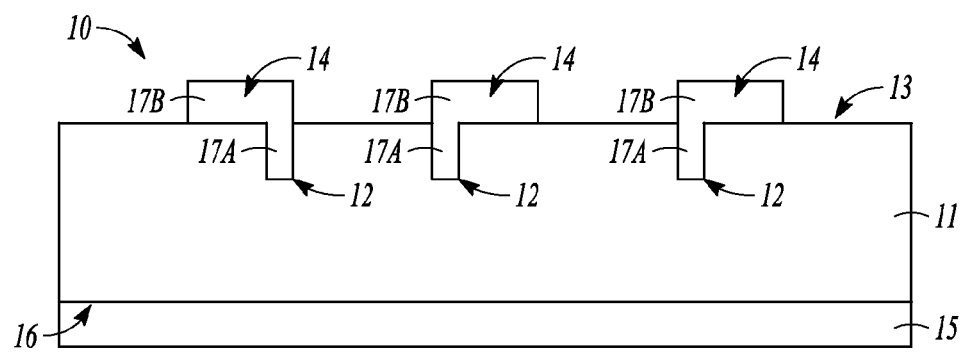
FIG. 12 shows an electrical interconnect that has been fabricated with misalignment between the first portion of the signal conductor and the second portion of the signal conductor.

All interconnects 10 are subject to manufacturing variances during fabrication of the electrical interconnects 10. FIG. 11 shows an electrical interconnect 10 that has been fabricated without any real misalignment between the first portion 17A of the signal conductor 14 and the second portion 17B of the signal conductor 14. In contrast, FIG. 12 shows an electrical interconnect 10 that has been fabricated with misalignment between the first portion 17A of the signal conductor 14 and the second portion 17B of the signal conductor 14.

The electrical interconnects 10 described herein may be less sensitive to any signal conductor 14 misalignment (i.e., minimal increased crosstalk and/or minimal change in impedance). Despite any misalignment of the first portion 17A of the signal conductor 14 relative to the second portion 17B of the signal conductor 14, the electrical interconnect 10 may still retain better electrical performance as compared to conventional interconnects.

Figure 13:
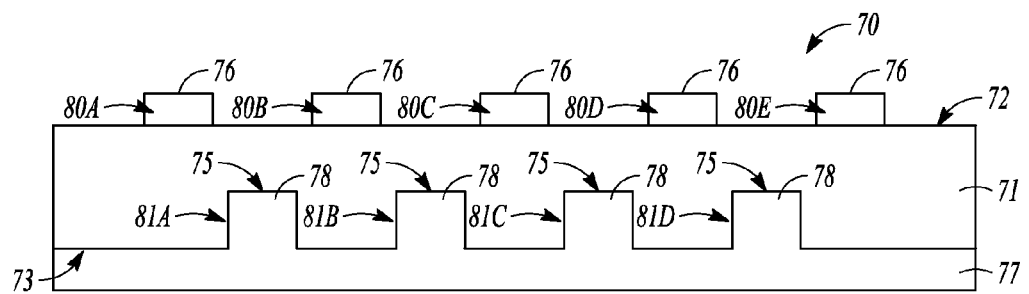
FIG. 13 illustrates another example an electrical interconnect for an electronic package.
Figure 14:
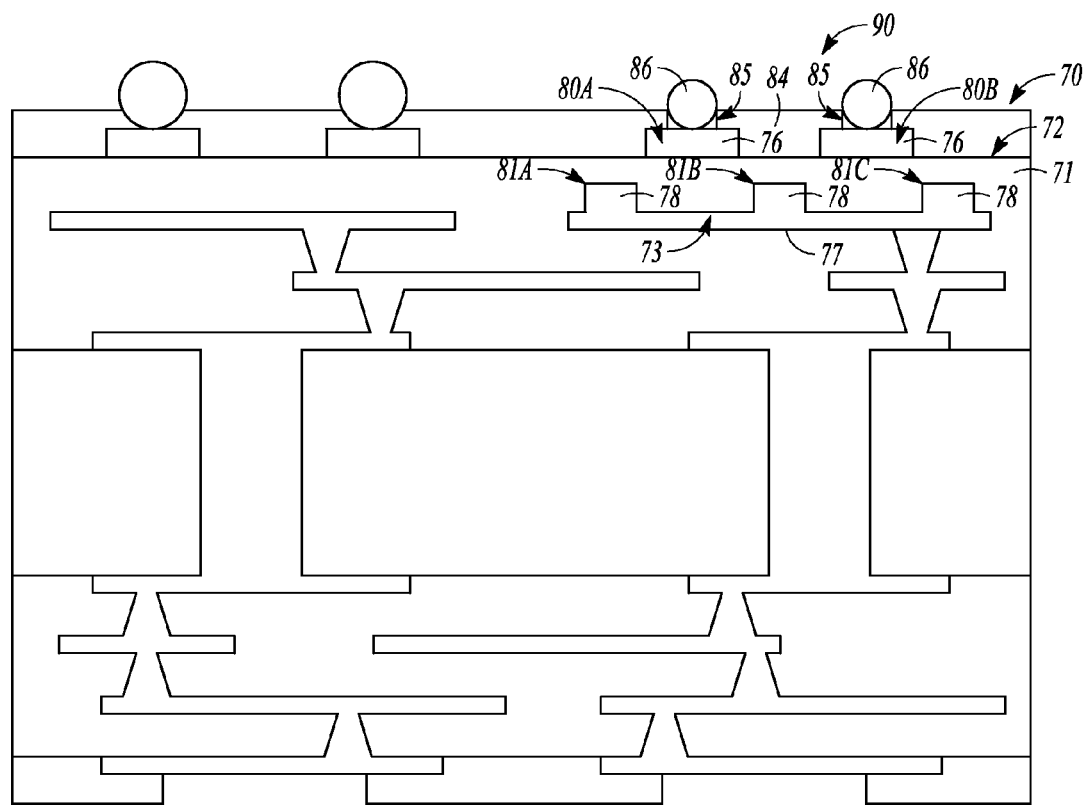
FIG. 14 illustrates an example electronic package that includes the example electrical interconnect of FIG. 13.

FIG. 13 illustrates another example electrical interconnect 70 for an electronic package 90 (example electronic package 90 is shown in FIG. 14). The electrical interconnect 70 includes a dielectric layer 71 that includes one surface 72 and an opposing surface 73. The opposing surface 73 includes a trench 75.

The electrical interconnect 70 further includes a signal conductor 76 on the one surface 72 of the dielectric layer 71 and a conductive reference layer 77 mounted on the opposing surface 73 of the dielectric layer 71. The conductive reference layer 77 engages the opposing surface 73 of the dielectric layer 71 and includes a protrusion 78 that fills the trench 75. The signal conductor 76 is electromagnetically coupled to the conductive reference layer 77 when current passes through the signal conductor 76.

The electrical interconnect 70 described herein may enable crosstalk isolations for high-speed single-ended interconnects (e.g., an on-package interconnect (OPI) bus). The protrusions 78 may provide shorter and more effective return paths to the signal conductor(s) 76. These shorter and more effective return paths may reduce far-end crosstalk (FEXT) as compared to conventional designs.

In addition, the protrusions 78 may improve overall eye-opening, electrical overshoot and undershoot performance at a device receiver as compared to conventional interconnects. The electrical interconnect 70 may also enable package layer count reduction (e.g., with a microstrip routing design versus stripline) and may also allow for the extension of channel length to permit routing flexibility.

As shown in FIG. 13, the signal conductor 76 may be a first signal conductor 80A and the electrical interconnect 10 may further include a second signal conductor 80B on the one surface 72 of the dielectric layer 71. The second signal conductor 80B is electromagnetically coupled to the conductive reference layer 77 when current passes through the second signal conductor 80B.

In the example form of the interconnect 70 shown in FIG. 13, the protrusion 78 of the conductive reference layer 77 is positioned equidistant from the first signal conductor 80A and the second signal conductor 80B. It should be noted that other locations are contemplated for the protrusion 78 relative to the first signal conductor 80A and the second signal conductor 80B.

In some forms of the interconnect 70, the opposing surface 73 of the dielectric layer 71 includes a plurality of trenches 81A, 81B, 81C, 81D, and the interconnect 70 further includes a plurality of signal conductors 80A, 80B, 80C, 80D, 80E on the one surface 72 of the dielectric layer 71. The conductive reference layer 77 includes a plurality of protrusions 78 that fill the trenches, wherein each of the signal conductors 80A, 80B, 80C, 80D, 80E is electromagnetically coupled to at least one of the protrusions 78 when current passes through the signal conductors 80A, 80B, 80C, 80D, 80E.

In the example form of the interconnect 70 shown in FIG. 13, at least some of the protrusions 78 are positioned equidistant from two different signal conductors 80A, 80B, 80C, 80D, 80E. It should be noted that other locations are contemplated for the protrusions 78 relative to the each of the signal conductors 80A, 80B, 80C, 80D, 80E.

FIG. 14 illustrates an example electronic package 90 that includes the example electrical interconnect 70 shown in FIG. 13. As shown in FIG. 14, the example electrical interconnect 70 may further include a second dielectric layer 84 mounted to the one surface 72 of the first dielectric layer 71. The second dielectric layer 84 includes an opening 85 that exposes the signal conductor 76. A solder bump 86 is electrically connected to the signal conductor 76 within the opening 85 in the second dielectric layer 84.

The interconnects 10, 70 described herein may be used in a variety of applications. As an example, the interconnects 10, 70 may be used in high-speed on-package interconnect (OPI) bus that interlinks two or more silicon devices on the same package substrate in the form of a multi-chip package (MCP).

Figure 15:
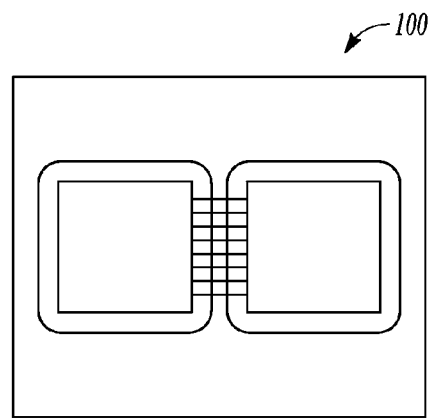
FIG. 15 is a top view of an example electronic device that includes a high-speed on-package interconnect (OPI) bus that interlinks two silicon devices.
Figure 16:
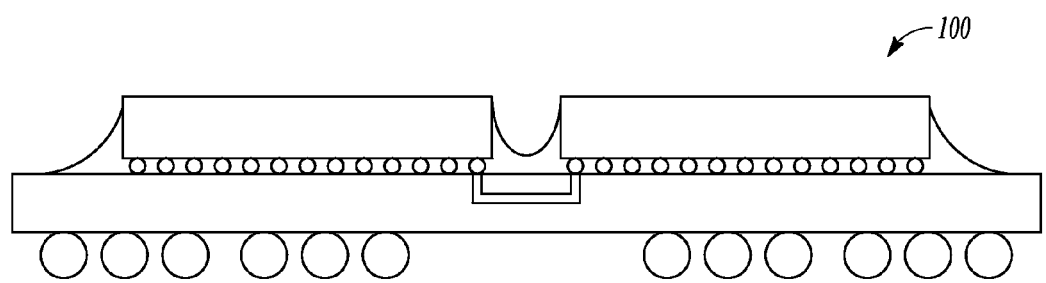
FIG. 16 is a side view of the electronic device shown in FIG. 15.

FIG. 15 is a top view of an example electronic device 100 that includes a high-speed on-package interconnect (OPI) bus that interlinks two silicon devices. FIG. 16 is a side view of the electronic device 100 shown in FIG. 15. It should be noted that the protrusions 78 in a conductive reference layer 77 may also be utilized in conjunction with routing at a motherboard level (not shown) (e.g., such as high-speed DDR memory bus).

Figure 17:
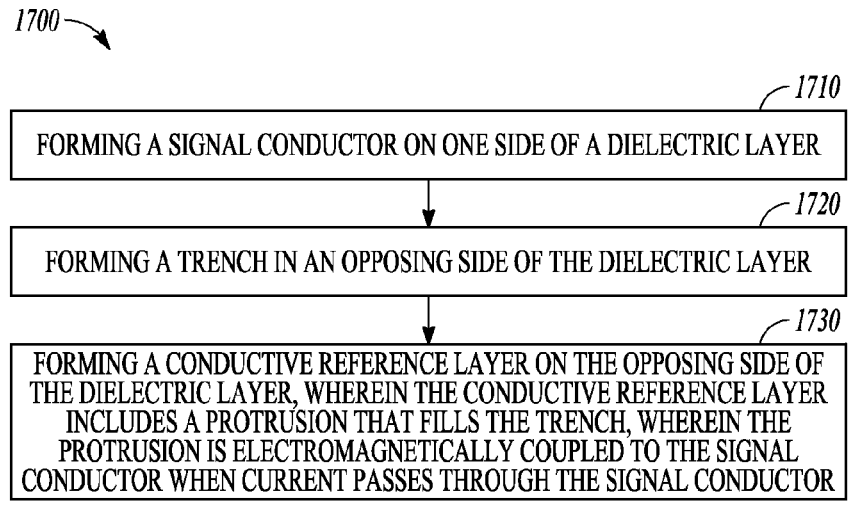
FIG. 17 is a flow diagram illustrating another example method of fabricating an electrical interconnect.

FIG. 17 is a flow diagram illustrating another example method [1700] of fabricating an electrical interconnect 70. The example method [1700] includes [1710] forming a signal conductor 76 on one side 72 of a dielectric layer 71 and [1720] forming a trench 75 in an opposing surface 73 of the dielectric layer 71. The method [1700] further includes [1730] forming a conductive reference layer 77 on the opposing side of the dielectric layer 71.

The conductive reference layer 77 includes a protrusion 78 that fills the trench 75. The protrusion 78 is electromagnetically coupled to the signal conductor 76 when current passes through the signal conductor 76.

In some forms of the method [1700], [1730] forming a conductive reference layer 77 on the opposing side 73 of the dielectric layer 71 and within the trench 75 includes electroplating the conductive reference layer 77 on the opposing side 73 of the dielectric layer 71 and within the trench 75. It should be noted that any other technique that is known now or discovered in the future may be used to form the conductive reference layer 77 on the opposing side 73 of the dielectric layer 71 and within the trench 75.

The method [1700] may further include forming a plurality of signal conductors 80A, 80B, 80C, 80D, 80E on one side 72 of a dielectric layer 71, and forming a plurality of trenches 81A, 81B, 81C, 81D in an opposing side 73 of the dielectric layer 71. The conductive reference layer 77 includes a plurality of protrusions 78 that fill the plurality of trenches 81A, 81B, 81C, 81D. Each of the protrusions 78 is electromagnetically coupled to corresponding signal conductors 80A, 80B, 80C, 80D, 80E when current passes through the respective signal conductors 80A, 80B, 80C, 80D, 80E.

In some forms of the method [1700], forming the plurality of trenches 81A, 81B, 81C, 81D in an opposing side 73 of the dielectric layer 71 includes forming the plurality of trenches 81A, 81B, 81C, 81D in an opposing side of the dielectric layer 71 such that at least some of the protrusions 78 are positioned equidistant from two different signal conductors 80A, 80B, 80C, 80D, 80E. It should be noted that other locations are contemplated for the protrusions 78 relative to the corresponding signal conductors 80A, 80B, 80C, 80D, 80E.

Figure 18:
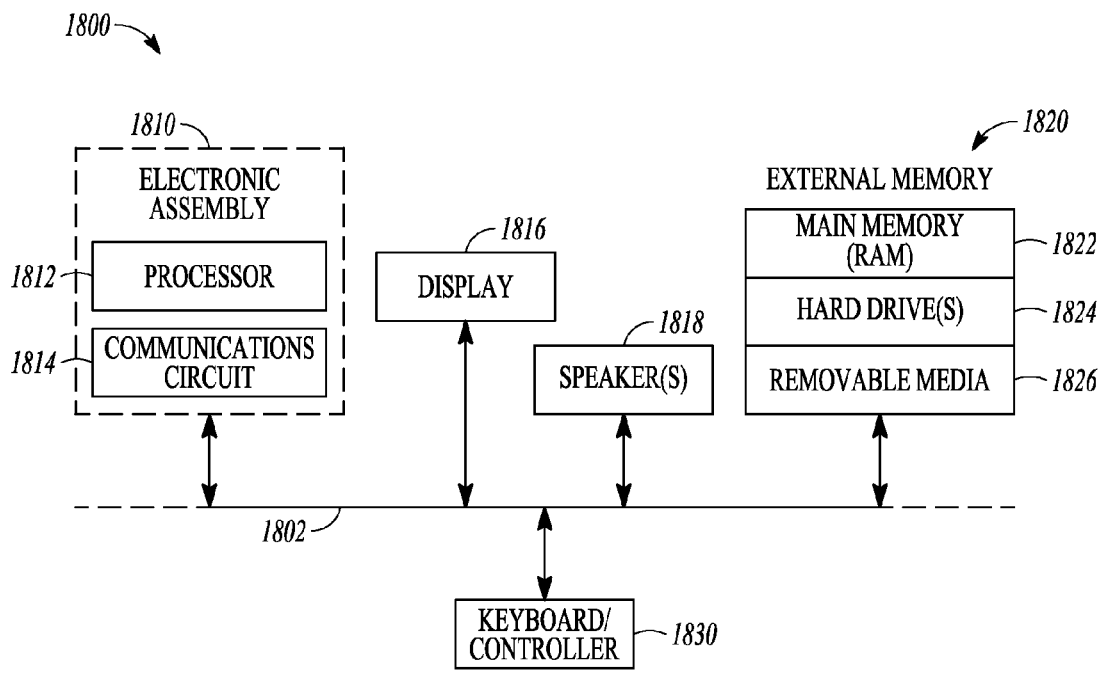
FIG. 18 is block diagram of an electronic apparatus that includes the electrical interconnects and/or electronic packages described herein.

FIG. 18 is a block diagram of an electronic apparatus 1800 incorporating at least one electronic interconnect 10, 70, electronic package 30A, 30B, 90, 100 and/or method [600], [1700] described herein. Electronic apparatus 1800 is merely one example of an electronic apparatus in which forms of the electronic interconnects 10, 70, electronic packages 30A, 30B, 90, 100 and/or methods [600], [1700] may be used.

Examples of an electronic apparatus 1800 include, but are not limited to, personal computers, tablet computers, mobile telephones, game devices, MP3 or other digital music players, etc. In this example, electronic apparatus 1800 comprises a data processing system that includes a system bus 1802 to couple the various components of the electronic apparatus 1800. System bus 1802 provides communications links among the various components of the electronic apparatus 1800 and may be implemented as a single bus, as a combination of busses, or in any other suitable manner.

An electronic assembly 1810 that includes any of the electronic interconnects 10, 70, electronic packages 30A, 30B, 90, 100 and/or methods [600], [1700] as describe herein may be coupled to system bus 1802. The electronic assembly 1810 may include any circuit or combination of circuits. In one embodiment, the electronic assembly 1810 includes a processor 1812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1810 are a custom circuit, an application-specific integrated circuit (ASIC), or the like, such as, for example, one or more circuits (such as a communications circuit 1814) for use in wireless devices like mobile telephones, tablet computers, laptop computers, two-way radios, and similar electronic systems. The IC can perform any other type of function.

The electronic apparatus 1800 may also include an external memory 1820, which in turn may include one or more memory elements suitable to the particular application, such as a main memory 1822 in the form of random access memory (RAM), one or more hard drives 1824, and/or one or more drives that handle removable media 1826 such as compact disks (CD), flash memory cards, digital video disk (DVD), and the like.

The electronic apparatus 1800 may also include a display device 1816, one or more speakers 1818, and a keyboard and/or controller 1830, which can include a mouse, trackball, touch screen, voice-recognition device, or any other device that permits a system user to input information into and receive information from the electronic apparatus 1800.

To better illustrate the method and apparatuses disclosed herein, a non-limiting list of embodiments is provided herein:

Example 1 includes an electrical interconnect for an electronic package. The electrical interconnect includes a dielectric layer that includes a trench formed into one surface of the dielectric layer and a signal conductor that fills the trench and extends above the one surface of dielectric layer. The electrical interconnect further includes a conductive reference layer mounted on an opposing side of the dielectric layer. The conductive reference layer is electromagnetically coupled to the signal conductor when current passes through the signal conductor.

Example 2 includes the electrical interconnect of example 1, wherein the signal conductor includes a first portion that fills the trench and a second portion that is above the trench.

Example 3 includes the electrical interconnect of any one of examples 1-2, wherein the first portion of the signal conductor is integral with the second portion of the signal conductor.

Example 4 includes the electrical interconnect of any one of examples 1-3, wherein the first portion of the signal conductor has a different width than the second portion of the signal conductor.

Example 5 includes the electrical interconnect of any one of examples 1-4, wherein the second portion of the signal conductor engages the one surface of the dielectric layer.

Example 6 includes the electrical interconnect of any one of examples 1-5, wherein the first portion of the signal conductor has a different thickness than the second portion of the signal conductor.

Example 7 includes the electrical interconnect of any one of examples 1-6, and further including a plurality of additional signal conductors where each of the additional signal conductors fills another trench in the dielectric layer and extends above the one surface of dielectric layer, wherein the plurality of additional signal conductors are each electromagnetically coupled to the conductive reference layer when current passes through the plurality of additional signal conductors.

Example 8 includes the electrical interconnect of any one of examples 1-7, wherein the dielectric layer is a first dielectric layer, and further including a second dielectric layer mounted to the one surface of the first dielectric layer, wherein the second dielectric layer includes an opening that exposes the signal conductor; and a solder bump that is electrically connected to the signal conductor within the opening the second dielectric layer.

Example 9 includes a method of fabricating an electrical interconnect for an electronic package. The method includes forming a trench in one side of dielectric layer, wherein the opposing side of the dielectric layer includes a conductive reference layer; and filling the trench in the one surface of a dielectric layer with a signal conductor that extends above the one surface of the dielectric layer, wherein the signal conductor is electromagnetically coupled to the conductive reference layer when current passes through the signal conductor.

Example 10 includes the method of example 9, wherein filling the trench in the one surface of a dielectric layer with a signal conductor that extends above the one surface of the dielectric layer includes forming a conductive material onto the one surface of the dielectric layer and within the trench in the dielectric layer, and forming a patterned mask onto the conductive material, wherein the patterned mask is on the one surface of the dielectric layer but not within the trench on the dielectric layer.

Example 11 includes the method of any one of examples 9-10, wherein filling the trench in the one surface of a dielectric layer with a signal conductor that extends above the one surface of the dielectric layer further includes adding conductive material within the trench to form the signal conductor that fills the trench and extends above the one surface of the dielectric layer, and removing the patterned mask and the conductive material from the one surface of the dielectric layer to form the signal conductor.

Example 12 includes the method of any one of examples 9-11, wherein forming a conductive material onto the one surface of the dielectric layer and within the trench in the dielectric layer includes electroless plating a conductive material onto the one surface of the dielectric layer and within the trenches in the dielectric layer.

Example 13 includes the method of any one of examples 9-12, wherein adding the conductive material within the trenches to form the signal conductor that fills the trench and extends above the one surface of the dielectric layer includes electrolytic plating the conductive material within the trenches to form the signal conductor that fills the trench and extends above the one surface of the dielectric layer.

Example 14 includes the method of any one of examples 9-13, wherein electrolytic plating the conductive material within the trenches to form the signal conductor that fills the trench and extends above the one surface of the dielectric layer includes electrolytic plating the conductive material onto the one surface of the dielectric layer such that the signal conductor engages the one surface of the dielectric layer.

Example 15 includes an electrical interconnect for an electronic package. The electrical interconnect includes a dielectric layer that includes one surface and an opposing surface, wherein the opposing surface includes a trench and a signal conductor on the one surface of the dielectric layer. The electrical interconnect further includes a conductive reference layer mounted on the opposing surface of the dielectric layer. The conductive reference layer engaging the opposing surface of the dielectric layer and including a protrusion that fills the trench, wherein the signal conductor is electromagnetically coupled to the conductive reference layer when current passes through the signal conductor.

Example 16 includes the electrical interconnect of example 15, wherein the signal conductor is a first signal conductor and further comprising a second signal conductor on the one surface of the dielectric layer, wherein the second signal conductor is electromagnetically coupled to the conductive reference layer when current passes through the second signal conductor.

Example 17 includes the electrical interconnect of any one of examples 15-16, wherein the protrusion of the conductive reference layer is positioned equidistant from the signal conductor and the second signal conductor.

Example 18 includes the electrical interconnect of any one of examples 15-17, wherein the opposing surface of the dielectric layer includes a plurality of trenches, and further comprising a plurality of additional signal conductors on the one surface of the dielectric layer, and wherein the conductive reference layer includes a plurality of protrusions that fill the trenches, wherein each of the signal conductors is electromagnetically coupled to at least one of the protrusions when current passes through the signal conductors.

Example 19 includes the electrical interconnect of any one of examples 15-18, wherein at least some of the protrusions are positioned equidistant from two different signal conductors.

Example 20 includes the electrical interconnect of any one of examples 15-19, wherein the dielectric layer is a first dielectric layer, and further including a second dielectric layer mounted to the one surface of the first dielectric layer, wherein the second dielectric layer includes an opening that exposes the signal conductor, and a solder bump that is electrically connected to the signal conductor within the opening the second dielectric layer.

Example 21 includes a method of fabricating an electrical interconnect for an electronic package. The method includes forming a signal conductor on one side of a dielectric layer; forming a trench in an opposing side of the dielectric layer; and forming a conductive reference layer on the opposing side of the dielectric layer, wherein the conductive reference layer includes a protrusion that fills the trench, wherein the protrusion is electromagnetically coupled to the signal conductor when current passes through the signal conductor.

Example 22 includes the method of example 21, wherein forming a conductive reference layer on the opposing side of the dielectric layer and within the trench includes electroplating the conductive reference layer on the opposing side of the dielectric layer and within the trench.

Example 23 includes the method of any one of examples 21-22, and further including forming a plurality of signal conductors on one side of a dielectric layer and forming a plurality of trenches in an opposing side of the dielectric layer, wherein the conductive reference layer includes a plurality of protrusions that fill the plurality of trenches, wherein each of the protrusions is electromagnetically coupled to corresponding signal conductors when current passes through the respective signal conductors.

Example 24 includes the method of any one of examples 21-23, wherein forming the plurality of trenches in an opposing side of the dielectric layer includes forming the plurality of trenches in an opposing side of the dielectric layer such that at least some of the protrusions are positioned equidistant from two different signal conductors.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electrical interconnect for carrying signals in an electronic package, comprising:
    a dielectric layer that is part of the electronic package, wherein the dielectric layer includes a trench formed into one surface of the dielectric layer, wherein the trench does not extend completely through the dielectric layer;
    a signal conductor that carries signals in the electronic package, wherein the signal conductor fills the trench and extends above the one surface of dielectric layer; and
    a conductive reference layer is part of the electronic package, wherein the conductive reference layer is mounted directly to an opposing side of the dielectric layer, wherein the conductive reference layer is electromagnetically coupled to the signal conductor when a signal passes through the signal conductor.

2. The electrical interconnect of claim 1, wherein the signal conductor includes a first portion that fills the trench and a second portion that is above the trench.

3. The electrical interconnect of claim 2, wherein the first portion of the signal conductor is integral with the second portion of the signal conductor.

4. The electrical interconnect of claim 2, wherein the first portion of the signal conductor has a different width than the second portion of the signal conductor.

5. The electrical interconnect of claim 4, wherein the second portion of the signal conductor engages the one surface of the dielectric layer.

6. The electrical interconnect of claim 2, wherein the first portion of the signal conductor has a different thickness than the second portion of the signal conductor.

7. The electrical interconnect of claim 1, further comprising a plurality of additional signal conductors where each of the additional signal conductors fills another trench in the dielectric layer and extends above the one surface of dielectric layer, wherein the plurality of additional signal conductors are each electromagnetically coupled to the conductive reference layer when current passes through the plurality of additional signal conductors.

8. The electrical interconnect of claim 1, wherein the dielectric layer is a first dielectric layer, and further comprising:
    a second dielectric layer mounted to the one surface of the first dielectric layer, wherein the second dielectric layer includes an opening that exposes the signal conductor; and
    a solder bump that is electrically connected to the signal conductor within the opening of the second dielectric layer.

9. A method of forming a device that carries signals in an electronic package, the method comprising:
    forming a trench in one side of a dielectric layer that is part of the electronic package, wherein the trench does not extend completely through the dielectric layer, wherein the opposing side of the dielectric layer includes a conductive reference layer that is part of the electronic package, wherein the conductive reference layer is mounted directly to the opposing side of the dielectric layer; and
    filling the trench in the one surface of a dielectric layer with a signal conductor that extends above the one surface of the dielectric layer, wherein the signal conductor is electromagnetically coupled to the conductive reference layer when a signal passes through the signal conductor.

10. The method of claim 9, wherein filling the trench in the one surface of a dielectric layer with a signal conductor that extends above the one surface of the dielectric layer comprises:
    forming a conductive material onto the one surface of the dielectric layer and within the trench in the dielectric layer; and
    forming a patterned mask onto the conductive material, wherein the patterned mask is on the one surface of the dielectric layer but not within the trench on the dielectric layer.

11. The method of claim 10, wherein filling the trench in the one surface of a dielectric layer with a signal conductor that extends above the one surface of the dielectric layer further comprises:
    adding conductive material within the trench to form the signal conductor that fills the trench and extends above the one surface of the dielectric layer; and
    removing the patterned mask and the conductive material from the one surface of the dielectric layer to form the signal conductor.

12. The method of claim 11, wherein forming a conductive material onto the one surface of the dielectric layer and within the trench in the dielectric layer includes electroless plating a conductive material onto the one surface of the dielectric layer and within the trenches in the dielectric layer.

13. The method of claim 11, wherein adding the conductive material within the trenches to form the signal conductor that fills the trench and extends above the one surface of the dielectric layer includes electrolytic plating the conductive material within the trenches to form the signal conductor that fills the trench and extends above the one surface of the dielectric layer.

14. The method of claim 13, wherein electrolytic plating the conductive material within the trenches to form the signal conductor that fills the trench and extends above the one surface of the dielectric layer includes electrolytic plating the conductive material onto the one surface of the dielectric layer such that the signal conductor engages the one surface of the dielectric layer.

15. An electrical interconnect for for carrying signals in an electronic package, comprising:
- a dielectric layer that is part of the electronic package, wherein the dielectric layer includes one surface and an opposing surface, wherein the opposing surface includes a trench, wherein the trench does not extend completely through the dielectric layer;
- a signal conductor carries signals in the electronic package, wherein the signal conductor is on the one surface of the dielectric layer; and
- a conductive reference layer is part of the electronic package, wherein the conductive reference layer is mounted on the opposing surface of the dielectric layer, the conductive reference layer engaging the opposing surface of the dielectric layer and including a protrusion that fills the trench, wherein the signal conductor is electromagnetically coupled to the conductive reference layer when a signal passes through the signal conductor.

16. The electrical interconnect of claim 15, wherein the signal conductor is a first signal conductor and further comprising a second signal conductor on the one surface of the dielectric layer, wherein the second signal conductor is electromagnetically coupled to the conductive reference layer when current passes through the second signal conductor.

17. The electrical interconnect of claim 16, wherein the protrusion of the conductive reference layer is positioned equidistant from the first signal conductor and the second signal conductor.

18. The electrical interconnect of claim 15, wherein the opposing surface of the dielectric layer includes a plurality of trenches, and further comprising a plurality of additional signal conductors on the one surface of the dielectric layer, and wherein the conductive reference layer includes a plurality of protrusions that fill the trenches, wherein each of the signal conductors is electromagnetically coupled to at least one of the protrusions when current passes through the signal conductors.

19. The electrical interconnect of claim 18, wherein at least some of the protrusions are positioned equidistant from two different signal conductors.

20. The electrical interconnect of claim 15, wherein the dielectric layer is a first dielectric layer, and further comprising:
- a second dielectric layer mounted to the one surface of the first dielectric layer, wherein the second dielectric layer includes an opening that exposes the signal conductor; and
- a solder bump that is electrically connected to the signal conductor within the opening the second dielectric layer.

21. A method of forming a device that carries signals in an electronic package, the method comprising:
- forming a signal conductor on one side of a dielectric layer, wherein dielectric layer is part of the electronic package and the signal conductor carries a signal in the electronic package;
- forming a trench in an opposing side of the dielectric layer, wherein the trench does not extend completely through the dielectric layer; and
- forming a conductive reference layer on the opposing side of the dielectric layer, wherein the conductive reference layer is part of the electronic package and includes a protrusion that fills the trench, wherein the protrusion is electromagnetically coupled to the signal conductor when a signal passes through the signal conductor.

22. The method of claim 21, wherein forming a conductive reference layer on the opposing side of the dielectric layer and within the trench includes electroplating the conductive reference layer on the opposing side of the dielectric layer and within the trench.

23. The method of claim 21, further comprising:
- forming a plurality of signal conductors on one side of a dielectric layer; and
- forming a plurality of trenches in an opposing side of the dielectric layer, wherein the conductive reference layer includes a plurality of protrusions that fill the plurality of trenches, wherein each of the protrusions is electromagnetically coupled to corresponding signal conductors when current passes through the respective signal conductors.

24. The method of claim 23, wherein forming the plurality of trenches in an opposing side of the dielectric layer includes forming the plurality of trenches in an opposing side of the dielectric layer such that at least some of the protrusions are positioned equidistant from two different signal conductors.

* * * * *